United States Patent [19]

Nicollini et al.

[11] Patent Number: 4,888,500

[45] Date of Patent: Dec. 19, 1989

[54] TTL-COMPATIBLE CELL FOR CMOS INTEGRATED CIRCUITS

[75] Inventors: Germano Nicollini, Piacenza; Pierangelo Confalonieri, Canonica D'Adda, both of Italy

[73] Assignee: SGS Thomson Microelectronics spa, Catania, Italy

[21] Appl. No.: 171,954

[22] Filed: Mar. 23, 1988

[30] Foreign Application Priority Data

Mar. 30, 1987 [IT] Italy ............................ 19896 A/87

[51] Int. Cl.[4] ................ H03K 19/092; H03K 3/01; H03K 19/094
[52] U.S. Cl. ........................... 307/475; 307/296.3; 307/451
[58] Field of Search .............. 307/443, 448, 451, 475, 307/296.3

[56] References Cited

FOREIGN PATENT DOCUMENTS 0138126  4/1985  European Pat. Off. .......... 30/451
0033017  2/1986  Japan ............................... 307/448

Primary Examiner—John S. Heyman
Assistant Examiner—Margaret R. Wambach
Attorney, Agent, or Firm—Wolf, Greenfield & Sacks

[57] ABSTRACT

The TTL-compatible cell comprising two cascade coupled CMOS inverters is associated with an input pin of the integrated circuit to make it suitable to receive signals in TTL logic, as well as with a power-down pin, and is characterized in that said input (10) of the CMOS integrated circuit is connected to the input of the first of said two inverters (12, 14) through a first and a second respectively P-channel and N-channel MOS transistor in parallel (28, 30), the first controlled by the power-down pin (31), the second by an inverter (32) driven by said power-down pin, so as to be both off when the power-down signal is at logical 1 and active when the power-down signal is at logical 0. Between the input of the first inverter and the ground a further MOS transistor (34) is connected the gate whereof is controlled so that said further MOS transistor is active when the power-down signal is at logical 1 and is off when the power-down signal is at logical 0.

3 Claims, 3 Drawing Sheets

TTL-COMPATIBLE CELL FOR CMOS INTEGRATED CIRCUITS

BACKGROUND OF THE INVENTION

1. Field of the invention

The present invention relates to a TTL-compatible cell to be included as signal input circuit in integrated electronic circuits in CMOS technology, to provide the CMOS chip with compatibility with TTL logics. More particularly, the invention relates to a TTL-compatible cell with nil power dissipation during the power-down of the integrated circuit.

2. Prior Art

As is known, very large scale integration (VLSI) electronic integrated circuits are often produced in CMOS technology to have low power dissipation. To further reduce the average power consumption it is also known to provide said CMOS chips with a deactivation or power-down pin, by enabling which one acts in a known manner on the chip to drastically lower the dissipation of the circuit (down to practically zero values) when the chip is not used, though power is still supplied thereto.

However, many input pins of the CMOS chip are required to be compatible with signals in TTL logic: this means that the input circuit to which the pin leads must recognize as logical 0 any voltage lower than 0.8 V, and as logical 1 any voltage above 2.0 V (sometimes 2.4 V). For this purpose an input circuit is used, known as "TTL-compatible cell", which must supply in output corresponding CMOS levels respectively of logical 0 and logical 1.

TTL-compatible cells of the prior art are substantially constituted by two cascade coupled inverters, the first whereof has a tripping threshold (for example 1.4 V) appropriate for discriminating between the above-said two TTL logic levels.

In power-down conditions, the consumption of said cell may remain relatively high since, as will be better explained hereinafter, there are intermediate levels of the TTL input signal (which is not under the control of the CMOS chip) such that a conductive path exists in the input inverter of the cell between the power supply and the ground, and therefore an amount of power appreciable if compared to the extremely low dissipations of the other elements of the chip is dissipated.

In known TTL-compatible cells the problem is solved, as will be explained in greater detail hereinafter, by providing the cell with a MOS transistor controlled by the inverter to force the TTL logic external to the chip so as to make its voltage vary to extreme values, such as to bring said inverter to non-dissipative conditions.

This solution, however, has the disadvantage of modifying the conditions of the external TTL logic, and this in certain cases is unacceptable, for example when the external TTL logic also drives other circuits. Furthermore, the solution is ineffective when the external logic is a voltage generator.

SUMMARY OF THE INVENTION

The aim of the invention is therefore to provide a TTL-compatible cell, to be included in CMOS chips, which can be brought to substantially zero-dissipation conditions during the power-down of the CMOS integrated circuit, without however affecting the state of the TTL circuits external to the chip.

The invention achieves the above described aim, as well as other objects and advantages which will become apparent hereinafter, with a TTL-compatible cell for CMOS integrated circuits, associated with an input pin of the integrated circuit to make it suitable to receive signals in TTL logic, comprising two cascade coupled CMOS inverters, the integrated circuit also having a power-down pin, characterized in that said input pin of the CMOS integrated circuit is connected to the input of the first of said two inverters through a first and a second respectively P-channel and N-channel MOS transistor in parallel, the first controlled by the power-down pin, the second by an inverter driven by said power-down pin, so as to be off when the power-down signal is at logical 1 and to be active when the power-down signal is at logical 0; and in that between the input of the first inverter and the ground a further MOS transistor is connected, the gate whereof is controlled so that said further MOS transistor is active when the power-down signal is at logical 1, and is off when the power-down signal is at logical 0.

BRIEF DESCRIPTION OF THE DRAWINGS

The invention is now described in greater detail, with reference to a preferred embodiment thereof, illustrated in the accompanying drawings, wherein.

DETAILED DESCRIPTION OF THE PREFERRED EMBODIMENTS

Figure 1:
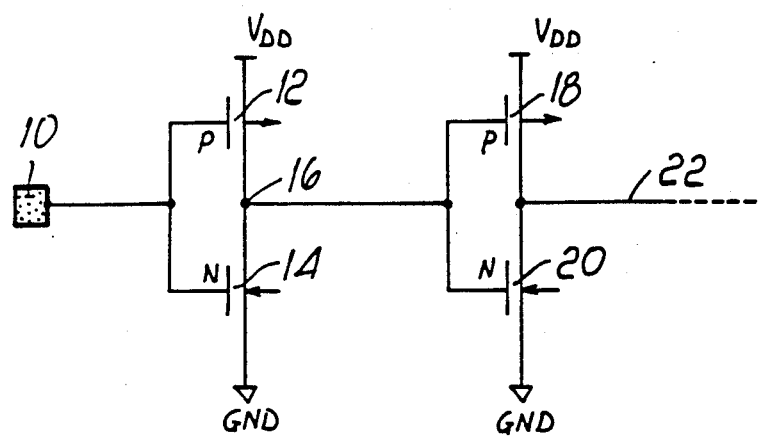
FIG. 1 is a circuit diagram of a first type of TTL-compatible cell according to the prior art.

With reference to FIG. 1, which refers to the prior art, an input pin 10 of a CMOS integrated circuit, not illustrated, is connected to the input of a first inverter constituted by two respectively P-channel and N-channel MOS transistors 12, 14, connected in series between the power supply voltage $V_{DD}$ (typically 5 V) and the ground GND. The node 16 between the transistors 12 and 14 is connected to the input of a second inverter formed by two MOS transistors 18, 20, in a manner similar to the first inverter. The output 22 of the second inverter 18, 20 constitutes the output of the TTL-compatible cell.

Figure 2:
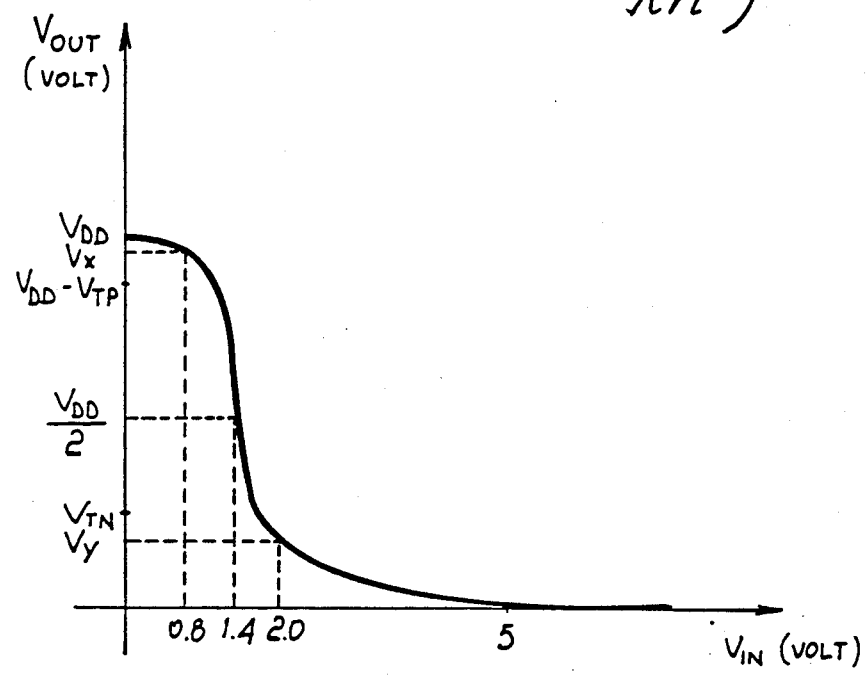
FIG. 2 is a graph of the output voltage of the cell of FIG. 1 as a function of the input voltage.

With reference also to the graph of FIG. 2, which illustrates the output voltage $V_{out}$ of the first inverter as a function of the input voltage $V_{in}$, it can be seen that, for all voltages from 0 V to 0.8 V applied to the pin 10, the node 16 is between $V_{DD}$ and $V_{x<VDD-VTP}$, $V_{TP}$ being the P-channel threshold d voltage of the inverter 18, 20; for all the input voltages from 2.0 V to $V_{DD}$, the node 16 is between 0 V (GND) and $V_y \leq V_{TN}$, this last being the N-channel threshold voltage of the inverter 18, 20. Therefore in the first case the inverter 18, 20 sees a logical 1 in input, a logical 0 in the second case.

As is known to the expert in the field, a CMOS inverter does not dissipate power when the input voltage differs by less than a threshold voltage from GND (N channel off) or from $V_{DD}$ (P channel off), since in such cases there is no conductive path between the power supply and the ground.

If instead the input voltage is comprised between $V_{TN}$ and $V_x = V_{DD} - V_{TP}$, as occurs for the first inverter 12, 4, both the N channel and the P channel conduct, and the output is set to a value which can be read from the graph of FIG. 2. For example, if the input is at 2 V, the output is at $V_y$. In these circumstances it can occur, for certain values of the voltage applied to the pin, that the first inverter of the TTL-compatible cell constituting a part of the CMOS chip dissipates an appreciable current if compared to the low values of the other currents of the circuit.

Figure 3:
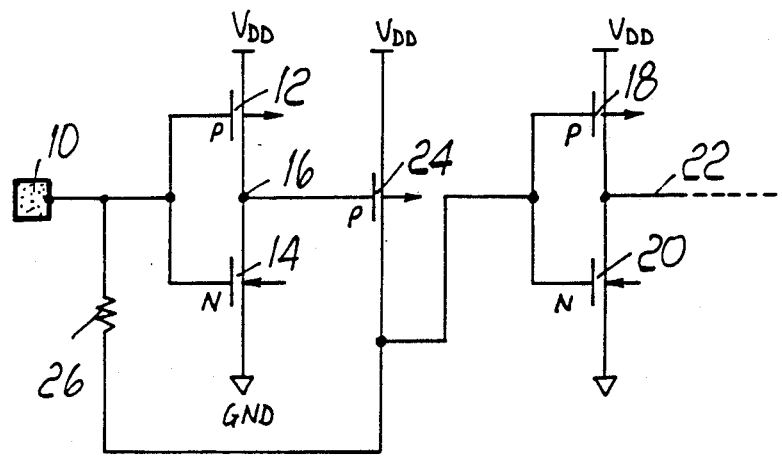
FIG. 3 is a circuit diagram of a second type of TTL-compatible cell according to the prior art.

To reduce or eliminate power dissipation in the TTL-compatible cell constituting a part of the CMOS chip, the cell of FIG. 1 has thus been improved as illustrated in FIG. 3, wherein the same reference numerals have been used for the components corresponding to FIG. 1. Between the first inverter 12, 14 and the second inverter 18, 20 a MOS transistor 24 has been interposed, having the drain at the supply voltage $V_{DD}$, and the source connected to the input of the second inverter 18, 20. The source of the transistor 24 is furthermore connected to the pin 10 through a limiting resistor 26. In this manner, if the voltage on the pin 10 assumes a value which would lead the TTL-compatible cell to dissipate power (e.g. 2.0 V), the voltage on the node 16 will be $V_y$, and therefore the transistor 24 will be driven by a high gate-source voltage. Therefore current will be formed through the limiting resistor 26 towards the pin 10 and then towards the external TTL circuit, the output voltage whereof, as is evident to the expert in the field, is thus forced to $V_{DD}$.

It is obvious, as already mentioned in the introduction, that this solution, since it can modify the conditions of the circuit external to the chip, is not acceptable if said external circuit also drives other chips. Furthermore, this solution is ineffective if the pin is controlled not by a TTL logic but by a voltage generator.

Figure 4:
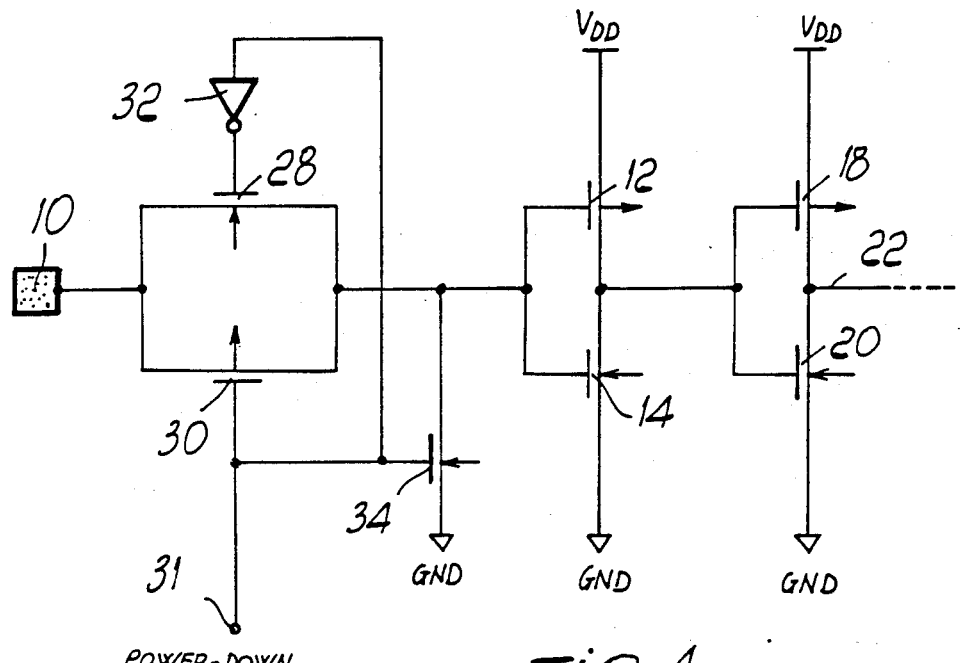
FIG. 4 is a circuit diagram of a TTL-compatible cell according to a first preferred embodiment of the invention.

According to the invention, and with reference to FIG. 4, the TTL-compatible cell again comprises a first and a second inverter, respectively 12, 14 and 18, 20, cascade coupled, similar to those of FIGS. 1 and 3. The pin 10, however, is not directly connected to the input of the first inverter, but through the source-drain paths of two respectively P-channel and N-channel MOS transistors 28, 30 in parallel. The gates of the transistors 28, 30 are controlled by the signal applied to the power-down pin 31 of the integrated circuit, respectively in a direct manner and through an inverter 32. The power-down signal also controls the gate of an N-channel transistor 34, connected between the input of the first inverter 12, 14 and the ground (GND).

It can be seen that, in normal operating conditions, that is to say when the power-down signal is at logical t0, the two transistors 28, 30 in parallel are both conductors, while the transistor 34 is off. Therefore the cell operates exactly like the one of FIG. 1, as if the added circuit comprising the components 28, 30, 32, 34 did not exist.

When the power-down signal becomes active, that is to say it goes to logical 1, the transistors 28, 30 are off, while the transistor 34 is conductive. Therefore the pin is isolated from the chip, while the input of the inverter 12, 15 is grounded, and therefore there are no conductive paths between $V_{DD}$ and GND for the inverter 12, 14 of the TTL-compatible cell.

The added circuit comprising the components 28, 30, 32, 34 therefore constitutes a circuit for separation between the circuits internal to the CMOS chip and the external circuits which drive the pin.

Figure 5:
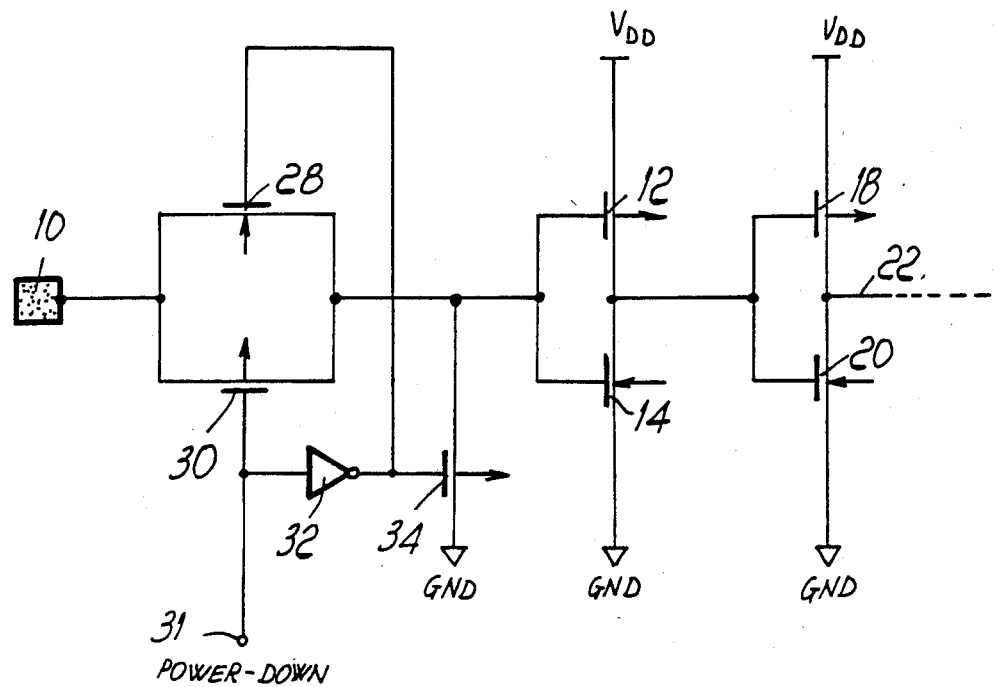
FIG. 5 is a circuit diagram of a TTL-compatible cell according to another preferred embodiment of the invention.

FIG. 5 illustrates a second embodiment of TTL-compatible cell according to the invention. This embodiment is similar to the first one, again comprising the first inverter 12, 14 and the second inverter 18, 20 in cascade, as well as the two transistors 30, 28 in parallel, controlled by the power-down pin 31 directly and through the inverter 32.

Differently from the first embodiment, the transistor 34 is in this case of the P-channel type, and its gate is controlled by the output of the inverter 32 instead of by the power-down pin 31. It is easy to see that the operation is equivalent.

Preferred embodiments of the invention have been described, but it is understood that they are susceptible to equivalent modifications and variations on the part of the expert in the field, according to the given teachings, without thereby abandoning the scope of the invention.

We claim:

1. TTL-compatible cell for CMOS integrated circuits, associated with an input pin of the integrated circuit to make it suitable for receiving signals in TTL logic, comprising:
    a first P-channel transistor and a second N-channel transistor, the drain of the P-channel transistor being connected to the source of the N-channel transistor and to said input pin, the source of the P-channel transistor being connected to the drain of the N-channel transistor and defining a common output;
    a power-down pin controlling the gate of said first P-channel transistor and controlling the gate of said second N-channel transistor through a first inverter, so as to turn said first and second transistors off when the power-down signal is at "logical 1" and to activate said first and said second transistors when the power-down signal is at "logical 0";
    a further MOS transistor, interposed between said common output and the ground, the drain thereof being connected to said output, the source thereof being grounded and the gate of said further MOS transistor being driven by said power-down pin, so as to be active when said power-down signal is at "logical" and off when said power-down signal is at "logical 0"; and
    two further serially coupled inverters, each inverter comprising a third P-channel transistor and a fourth N-channel transistor, the gates thereof being mutually coupled to form an inverter input, the drain of said fourth transistor being connected to the source of said third transistor to form an inverter output, the drain of said third transistor being connected to a reference voltage line and the source of said fourth transistor being grounded, the inverter input of the first of said further inverters being connected to said common output.

2. TTL-compatible cell for CMOS integrated circuits according to claim 1 wherein said further MOS transistor is of the N-channel type, and its gate is connected to the power-down pin.

3. TTL-compatible cell for CMOS integrated circuits according to claim 1 wherein said further MOS transistor is of the P-channel type, and its gate is connected to the output of said first inverter driven by the power-down pin.

* * * * *

UNITED STATES PATENT AND TRADEMARK OFFICE
CERTIFICATE OF CORRECTION

PATENT NO. : 4,888,500
DATED : December 19, 1989
INVENTOR(S) : Germano Nicollini, et. al.

It is certified that error appears in the above-indentified patent and that said Letters Patent is hereby corrected as shown below:

In column 3, line 59, please replace "t0" with --0--.

In column 4, line 47, please insert --1-- between "logical" and "and".

Signed and Sealed this

Twenty-ninth Day of July, 1997

Attest:

BRUCE LEHMAN

Attesting Officer

Commissioner of Patents and Trademarks